United States Patent
Gentili et al.

(10) Patent No.: US 11,294,028 B2
(45) Date of Patent: Apr. 5, 2022

(54) SENSING SYSTEM WITH ENHANCED ELECTRICAL CONTACT AT PCB-WAVEGUIDE INTERFACE

(71) Applicant: Magna Electronics Inc., Auburn Hills, MI (US)

(72) Inventors: Fabrizio Gentili, Aschaffenburg (DE); Wilhelm Johann Wolfgang Wöhlte, Sailauf (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 253 days.

(21) Appl. No.: 16/775,617

(22) Filed: Jan. 29, 2020

(65) Prior Publication Data

US 2020/0241107 A1    Jul. 30, 2020

Related U.S. Application Data

(60) Provisional application No. 62/798,195, filed on Jan. 29, 2019.

(51) Int. Cl.
*G01S 7/03* (2006.01)
*G01S 13/931* (2020.01)
*H01Q 1/32* (2006.01)
*H01P 3/12* (2006.01)

(52) U.S. Cl.
CPC ............ *G01S 7/032* (2013.01); *G01S 13/931* (2013.01); *H01P 3/121* (2013.01); *H01Q 1/3233* (2013.01)

(58) Field of Classification Search
None
See application file for complete search history.

(56) References Cited

U.S. PATENT DOCUMENTS

| | | |
|---|---|---|
| 6,587,186 B2 | 7/2003 | Bamji et al. |
| 6,674,895 B2 | 1/2004 | Rafii et al. |
| 6,678,039 B2 | 1/2004 | Charbon |
| 6,690,354 B2 | 2/2004 | Sze |
| 6,710,770 B2 | 3/2004 | Tomasi et al. |
| 6,876,775 B2 | 4/2005 | Torunoglu |
| 6,906,793 B2 | 6/2005 | Bamji et al. |
| 6,919,549 B2 | 7/2005 | Bamji et al. |
| 7,053,357 B2 | 5/2006 | Schwarte |
| 7,157,685 B2 | 1/2007 | Bamji et al. |
| 7,176,438 B2 | 2/2007 | Bamji et al. |

(Continued)

FOREIGN PATENT DOCUMENTS

WO    2011090484 A1    7/2011

*Primary Examiner* — Peter M Bythrow
(74) *Attorney, Agent, or Firm* — Honigman LLP (57) ABSTRACT

A radar sensing system for a vehicle includes a radar sensor disposed at the vehicle so as to sense exterior of the vehicle. The radar sensor includes a plurality of transmitters that transmit radio signals, and a plurality of receivers that receive radio signals, with the received radio signals being transmitted radio signals that are reflected from an object. A processor is operable to process outputs of the receivers. The radar sensor includes a printed circuit board having circuitry disposed thereat and at least one waveguide having an interface end in electrical contact with the printed circuit board. The at least one waveguide includes at least one notch at the interface end that reduces an area of electrical contact between the at least one waveguide and the printed circuit board and increases pressure at the electrical contact area.

20 Claims, 6 Drawing Sheets

(56) References Cited

U.S. PATENT DOCUMENTS

| | | | |
|---|---|---|---|
| 7,203,356 B2 | 4/2007 | Gokturk et al. | |
| 7,212,663 B2 | 5/2007 | Tomasi | |
| 7,283,213 B2 | 10/2007 | O'Connor et al. | |
| 7,310,431 B2 | 12/2007 | Gokturk et al. | |
| 7,321,111 B2 | 1/2008 | Bamji et al. | |
| 7,340,077 B2 | 3/2008 | Gokturk et al. | |
| 7,352,454 B2 | 4/2008 | Bamji et al. | |
| 7,375,803 B1 | 5/2008 | Bamji | |
| 7,379,100 B2 | 5/2008 | Gokturk et al. | |
| 7,379,163 B2 | 5/2008 | Rafii et al. | |
| 7,405,812 B1 | 7/2008 | Bamji | |
| 7,408,627 B2 | 8/2008 | Bamji et al. | |
| 7,881,689 B2 * | 2/2011 | Leblanc | H05K 9/0007 455/300 |
| 8,013,780 B2 | 9/2011 | Lynam | |
| 8,027,029 B2 | 9/2011 | Lu et al. | |
| 9,036,026 B2 | 5/2015 | Dellantoni et al. | |
| 9,146,898 B2 | 9/2015 | Ihlenburg et al. | |
| 9,332,680 B2 * | 5/2016 | Ding | H05K 9/0016 |
| 9,575,160 B1 | 2/2017 | Davis et al. | |
| 9,599,702 B1 | 3/2017 | Bordes et al. | |
| 9,689,967 B1 | 6/2017 | Stark et al. | |
| 9,753,121 B1 | 9/2017 | Davis et al. | |
| 10,056,922 B1 * | 8/2018 | Tsvelykh | H01P 1/20345 |
| 2003/0179147 A1 * | 9/2003 | King | H01Q 1/247 343/786 |
| 2005/0225481 A1 * | 10/2005 | Bonthron | G01S 13/282 342/175 |
| 2006/0000591 A1 * | 1/2006 | Adams | H01L 23/3733 165/185 |
| 2009/0251362 A1 * | 10/2009 | Margomenos | G01S 13/931 342/175 |
| 2010/0245066 A1 | 9/2010 | Sarioglu et al. | |
| 2011/0140811 A1 * | 6/2011 | Leiba | H01P 5/107 333/24 R |
| 2012/0187511 A1 * | 7/2012 | Maurer | H01Q 13/06 257/428 |
| 2014/0240187 A1 * | 8/2014 | Herbsommer | H01Q 13/00 343/785 |
| 2015/0181346 A1 * | 6/2015 | Jingming | H04R 1/02 381/114 |
| 2015/0333724 A1 * | 11/2015 | Lahti | H01P 1/201 343/860 |
| 2015/0346322 A1 * | 12/2015 | Schmalenberg | G01S 13/02 342/175 |
| 2017/0222311 A1 | 8/2017 | Hess et al. | |
| 2017/0254873 A1 | 9/2017 | Koravadi | |
| 2017/0276788 A1 | 9/2017 | Wodrich | |
| 2017/0315231 A1 | 11/2017 | Wodrich | |
| 2017/0356994 A1 | 12/2017 | Wodrich et al. | |
| 2018/0015875 A1 | 1/2018 | May et al. | |
| 2018/0045812 A1 | 2/2018 | Hess | |
| 2018/0231635 A1 | 8/2018 | Woehlte | |
| 2018/0231657 A1 * | 8/2018 | Woehlte | H01Q 1/3233 |
| 2018/0301817 A1 * | 10/2018 | Ichinose | G01S 7/03 |
| 2019/0057945 A1 * | 2/2019 | Maaskant | H01Q 13/02 |
| 2019/0204508 A1 * | 7/2019 | Elsherbini | G02B 6/2852 |
| 2019/0339382 A1 | 11/2019 | Hess et al. | |
| 2020/0076038 A1 * | 3/2020 | Kamo | G01S 13/42 |
| 2020/0137913 A1 * | 4/2020 | Wohlte | H01Q 1/3208 |
| 2020/0185802 A1 * | 6/2020 | Vilenskiy | H01Q 21/0006 |
| 2020/0266516 A1 * | 8/2020 | Uemichi | H01P 5/082 |
| 2020/0365535 A1 * | 11/2020 | de Graauw | H01L 23/4952 |
| 2020/0388899 A1 * | 12/2020 | Yung | H01Q 9/045 |
| 2020/0403307 A1 * | 12/2020 | Ahmadloo | H01Q 21/065 |

* cited by examiner

PRIOR ART

SENSING SYSTEM WITH ENHANCED ELECTRICAL CONTACT AT PCB-WAVEGUIDE INTERFACE

CROSS REFERENCE TO RELATED APPLICATION

The present application claims the filing benefits of U.S. provisional application Ser. No. 62/798,195, filed Jan. 29, 2019, which is hereby incorporated herein by reference in its entirety.

FIELD OF THE INVENTION

The present invention relates generally to a vehicle sensing system for a vehicle and, more particularly, to a vehicle sensing system that utilizes one or more radar sensors at a vehicle.

BACKGROUND OF THE INVENTION

It is known to provide radar sensing systems at vehicles. Examples of such systems are described in U.S. Pat. Nos. 9,575,160; 8,013,780 and/or 7,053,357, which are hereby incorporated herein by reference in their entireties.

SUMMARY OF THE INVENTION

The present invention provides a driving assistance system or sensing system or vehicle control system for a vehicle that utilizes one or more radar sensors to sense regions exterior of the vehicle, with the radar sensor transmitting and receiving signals, and with the received signals processed to detect the presence of objects at or near the vehicle in the field of sensing of the sensor. The radar sensor includes a printed circuit board (PCB) and at least one waveguide in electrical contact with the PCB. The waveguide includes a wall having an interface or electrically connecting end that is in electrical contact with the printed circuit board. The wall may at least partially bound a portion of the printed circuit board and have an inboard side facing inboard toward the at least partially bounded portion of the printed circuit board and an outboard side facing outboard away from the at least partially bounded portion of the printed circuit board. The at least one waveguide includes at least one gap or notch (such as an air gap or a gap filled with a non-electrically conductive material or the like) that reduces an area of electrical contact between the at least one waveguide and the PCB. The at least one waveguide may be secured to the PCB via one or more fasteners. The gap may expose a portion of the fastener and increase a pressure provided by the fastener(s) at an edge of a side of the waveguide.

These and other objects, advantages, purposes and features of the present invention will become apparent upon review of the following specification in conjunction with the drawings.

DESCRIPTION OF THE PREFERRED EMBODIMENTS

A vehicle sensing system and/or driver assist system and/or driving assist system and/or object detection system and/or alert system operates to capture sensing data exterior of the vehicle and may process the captured data to detect objects at or near the vehicle and in the predicted path of the vehicle, such as to assist a driver of the vehicle or a control for an autonomous vehicle in maneuvering the vehicle in a forward or rearward direction. The system includes a processor that is operable to receive sensing data from one or more sensors and provide an output, such as an alert or control of a vehicle system.

Figure 1:
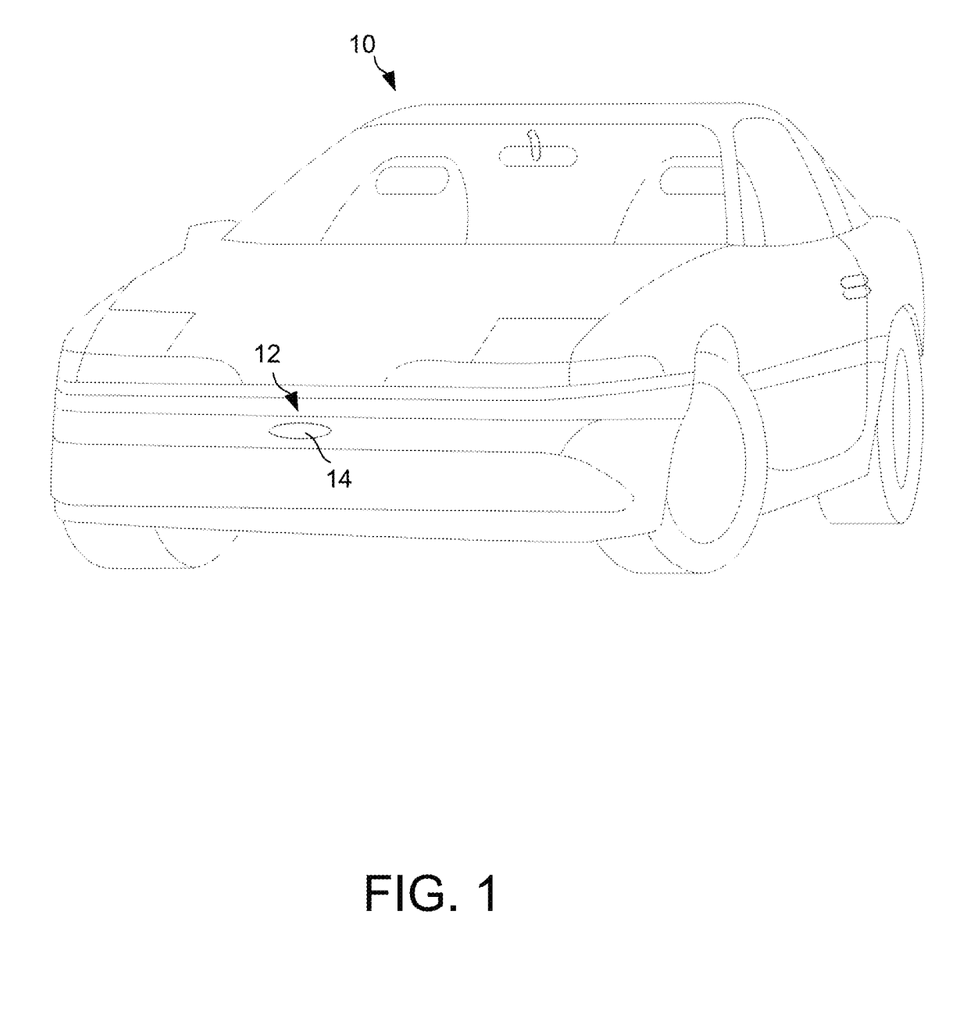
FIG. 1 is a perspective view of a vehicle with a sensing system that incorporates a radar sensor in accordance with the present invention.

Referring now to the drawings and the illustrative embodiments depicted therein, a vehicle 10 (FIG. 1) includes an driving assistance system or sensing system 12 that includes at least one radar sensor unit, such as a forward facing radar sensor unit 14 (and the system may optionally include multiple exterior facing sensors, such as cameras or other sensors, such as a rearward facing sensor at the rear of the vehicle, and a sideward/rearward facing sensor at respective sides of the vehicle), which sense regions exterior of the vehicle. The sensing system 12 includes a control or electronic control unit (ECU) or processor that is operable to process data captured by the sensor or sensors and may detect objects or the like. The data transfer or signal communication from the sensor to the ECU may comprise any suitable data or communication link, such as a vehicle network bus or the like of the equipped vehicle.

The radar sensor or sensors of the driving assist system 12 may be used in conjunction with a plurality of image sensors mounted at the equipped vehicle and/or with at least one lidar sensor also mounted (along with the image sensors and the radar sensor) at the equipped vehicle. Image data and radar data and lidar data are provided to a central electronic control unit (ECU) or module for processing thereat. The ECU includes at least one processor that processes the captured/sensed data, whereby one or more functions or systems (such as a braking system and/or steering system and/or the like) of the vehicle is controlled responsive to processing of the captured/sensed data.

Figure 2:
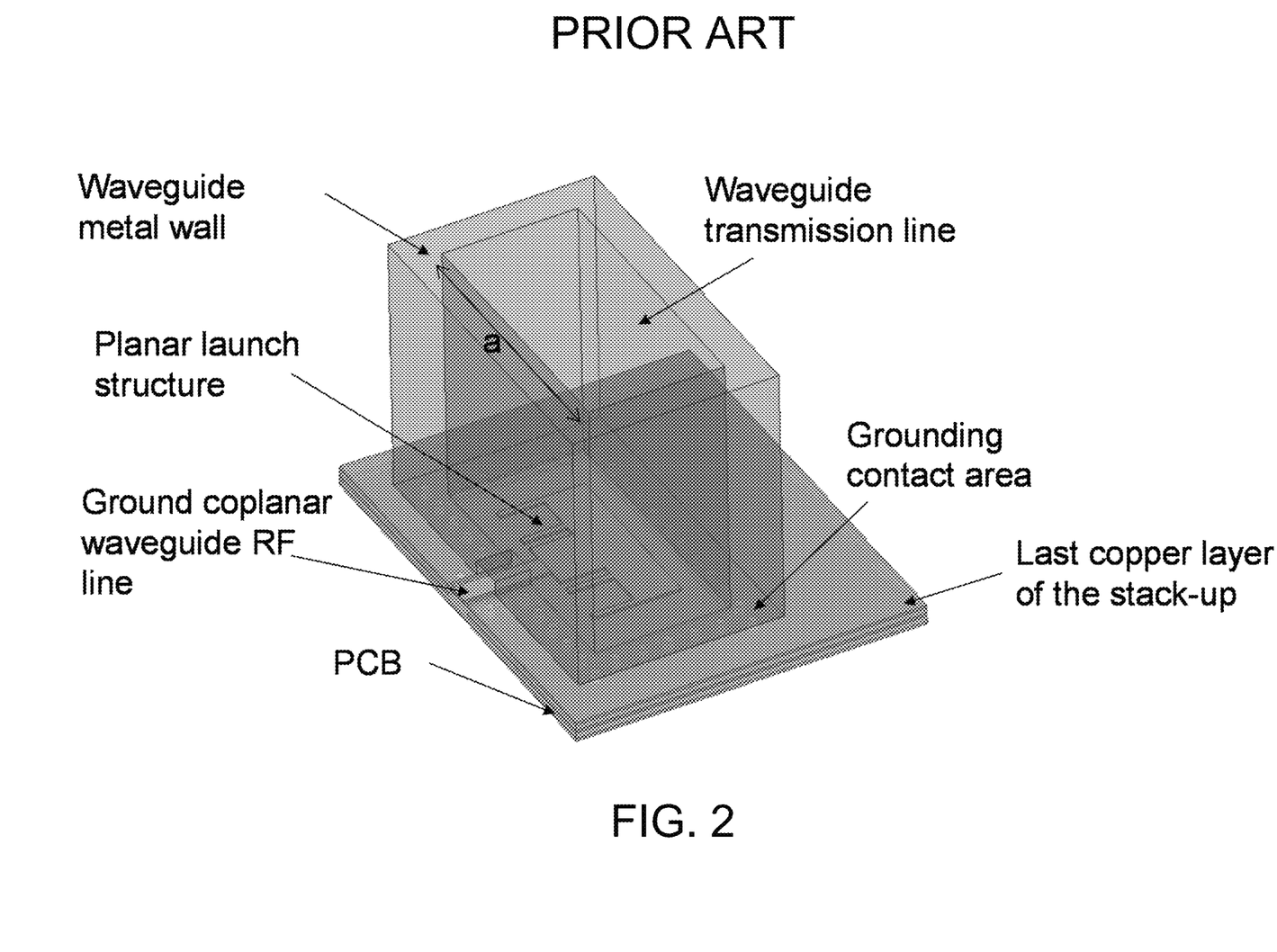
FIG. 2 is a perspective view of a known wall-to-wall printed circuit board (PCB) to waveguide interface.

The system includes one or more transmitter antennas and one or more receiver antennas, which are suitably connected to the rest of the RF circuitry realized in PCB technology. The PCB technology may include a multi-layer PCB. Automotive radars may use waveguides to direct or restrict signals to or from the antenna. For example, a waveguide may reduce energy loss of a transmission by restricting the direction the transmission propagates. A point where the RF signal passes from the PCB circuitry into a waveguide transmission line is referred to as "transition". Commonly, and as shown in FIG. 2, the transition may include a planar launch structure feeding a waveguide placed directly thereabove. The transition is designed to transfer the RF signal from the PCB into the waveguide aperture with minor RF performance degradation.

The waveguide may include a metal wall that at least partially surrounds the planar launch structure to direct the transmissions in the desired direction. The waveguide is electrically connected (i.e., grounded) to the PCB through exposed metal (i.e., a grounding contact area) at the surface of the PCB (e.g., a top or last copper layer of the PCB), to realize a wall-to-wall connection. Ground continuity between the PCB and the waveguide (e.g., via the ground contacts) is critical to minimize radio frequency (RF) losses. Fasteners (e.g., fastening screws) are typically used to achieve the required pressure between the waveguide and the exposed ground contacts on the PCB.

Figure 3:
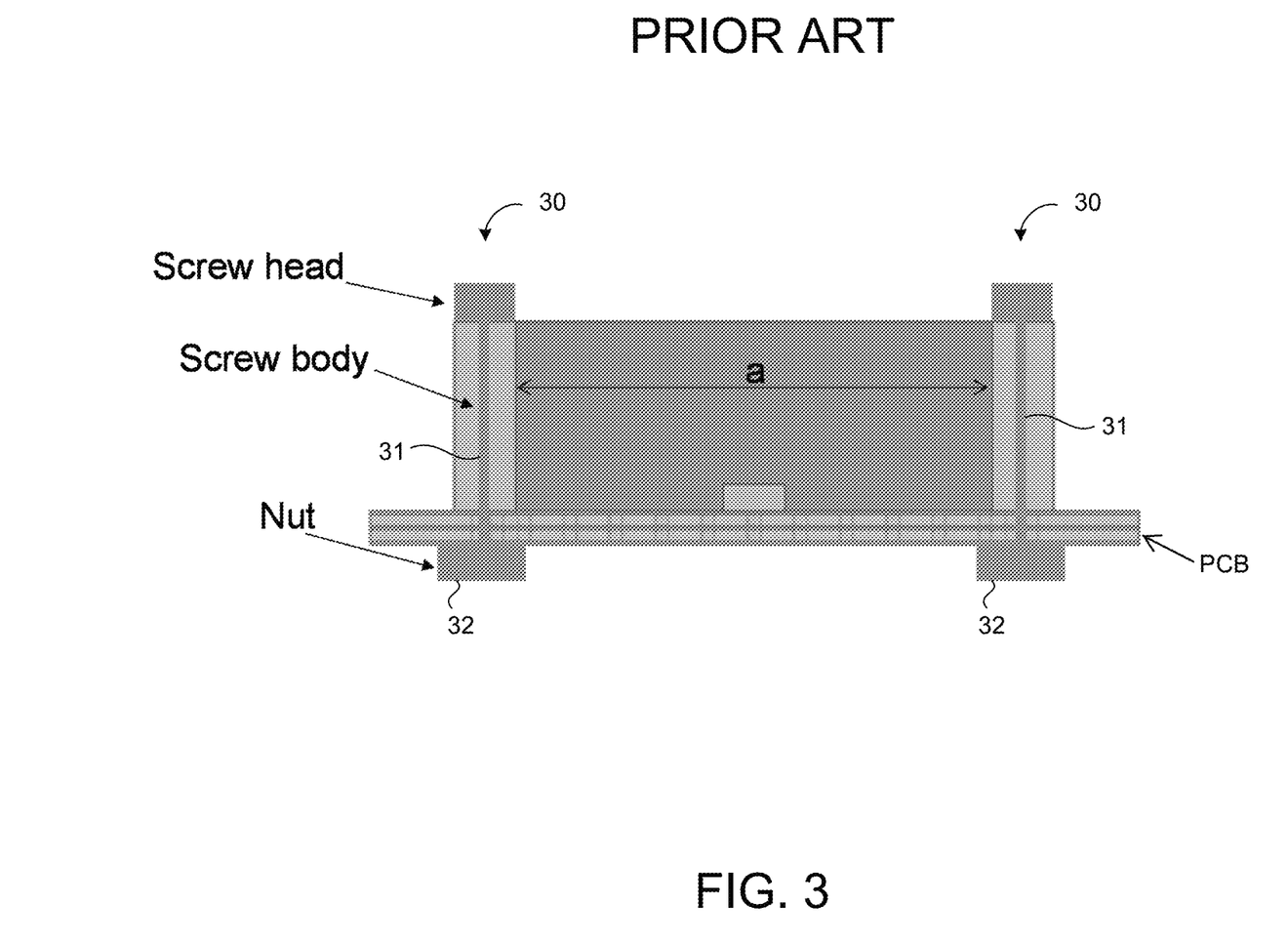
FIG. 3 is a plan view of the PCB to waveguide interface of FIG. 2.
Figure 4:
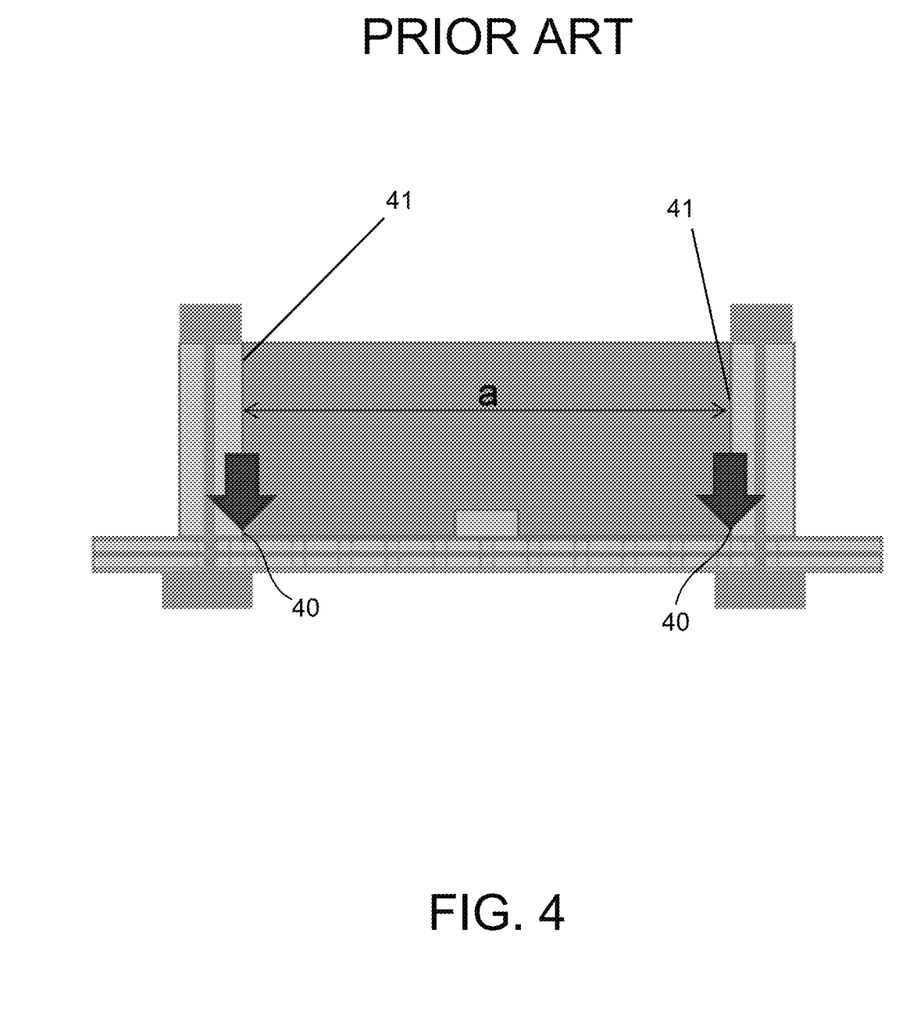
FIG. 4 is another plan view of the PCB to waveguide interface of FIG. 2.
Figure 5A:
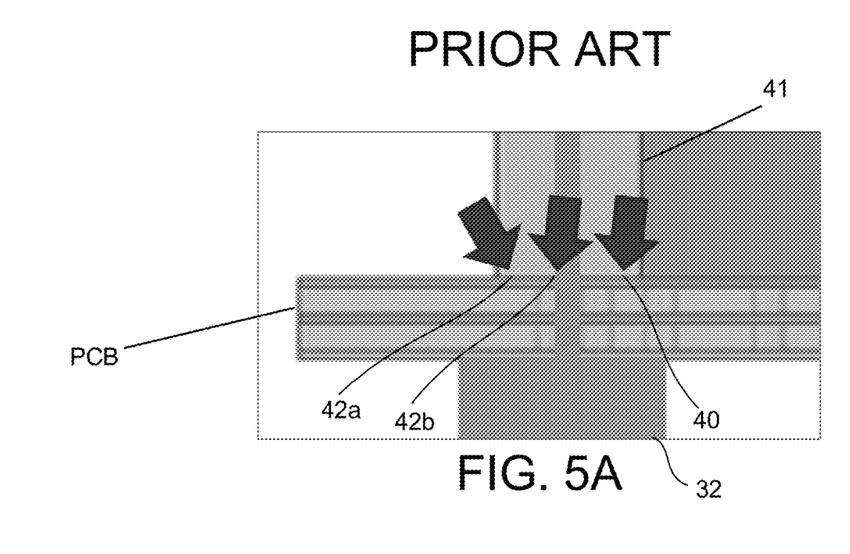
FIGS. 5A and 5B are enlarged plan views of a portion of the PCB to waveguide interface of FIG. 2.

Referring now to FIG. 3, the typical wall-to-wall PCB to waveguide interface may include a fastener 30 (such as a screw) at each vertex or corner of the waveguide. For example, the waveguide may comprise a shape, such as a rectangular shape, having a plurality of vertices (such as four vertices for the rectangular-shaped waveguide), with a fastener at each vertex or corner of the shaped waveguide. The fastener 30 may include a threaded body 31 that passes through the waveguide and the PCB and is secured via a nut 32 (or other appropriate fastener). Referring now to FIG. 4, the one or more fasteners 30 secure the waveguide to the PCB and create an electrical contact point 40 between the waveguide and the PCB. The electrical contact is ideally as close as possible to an edge 41 of the waveguide to minimize RF losses (e.g., insertion losses) and minimize cross talk from other nearby or adjacent transmitters/receivers. However, as illustrated in FIG. 5A, the typical wall-to-wall interface does not guarantee that the fastener(s) 30 create a contact point 40 that is at the ideal location (i.e., at the edge 41). Instead, the fastener 30 may create a contact point anywhere along the points supported by the nut 32 (e.g., points 42a, 42b in FIG. 5A).

As a result, electrical currents do not flow continuously between the PCB and the waveguide, as illustrated by the vertical dashed line or path 50, but instead are deviated by gaps in contact, as illustrated by the curved line or path 52. This deviation increases the distance traveled by the electric current, and because series resistance increases with distance, the extra distance the current travels when using path 52 increases the series resistance versus series resistance when the current travels using the path 50. The increased series resistance increases RF losses.

Figure 6A:
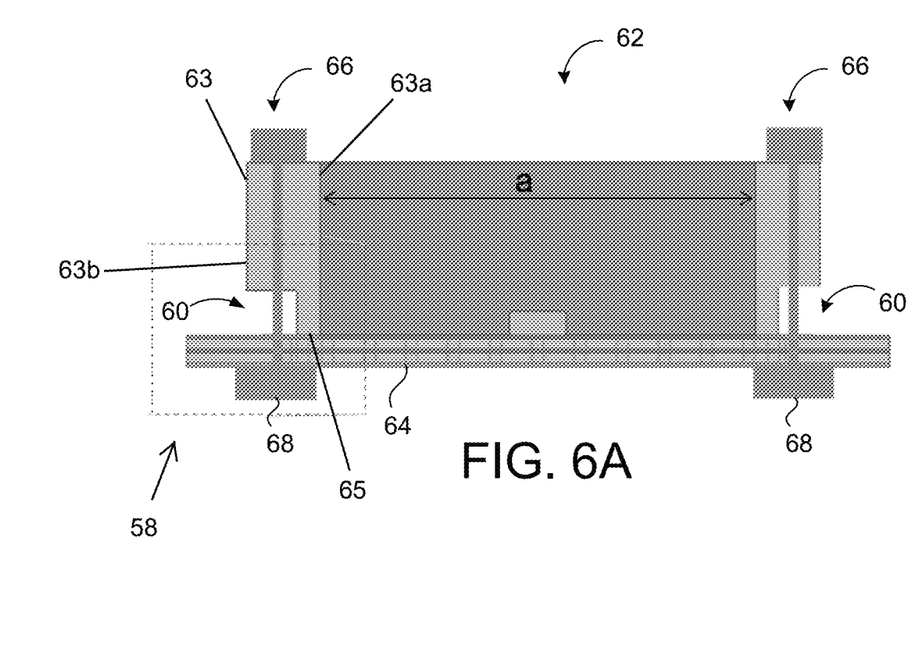
FIG. 6A is a plan view of a PCB to waveguide interface in accordance with the present invention.

Referring now to FIG. 6A, in accordance with an aspect of the invention, a vehicular radar sensing system includes a waveguide that includes at least one wall 63 having an interface end 65 that is in electrical contact with the PCB 64. That is, the wall 63 includes at least one point or surface area (e.g., point or area 67) that is in electrical contact with the PCB 64. The wall 63 at least partially bounds or circumscribes or borders or surrounds a portion of the PCB 64 (the portion that has the planar launch structure thereat) and has an inboard side 63a that faces inboard toward the at least partially bounded portion of the PCB 64 and an outboard side 63b facing outboard away from the at least partially bounded portion of the PCB 64. A notch or recess or cutout or gap 60 at at least one of the waveguide walls (i.e., at the interface end of the waveguide that contacts or interfaces with the PCB) that at least partially bounds the portion of the PCB is established to reduce an area of electrical contact between the waveguide 62 and the PCB 64, with the reduced area (e.g., area 67 in FIG. 6B) being inboard of the notch or gap and reduced as compared to the surface area of the interface end of the waveguide wall at that location if the gap were not present. The air gap 60 may comprise a scooped out or cutout or hollowed out or removed or recessed portion of the waveguide wall at the interface end, and optionally may be filled with a non-electrically conductive material or the like. The air gap 60 may be at a fastener 66 or a port that the fastener 66 passes through and may expose a portion of the fastener 66 or port (e.g., a portion of the outboard part of the wall is removed so that at least a portion of the fastener at that location is exposed while the rest of the fastener is within and along the waveguide wall).

Figure 5B:
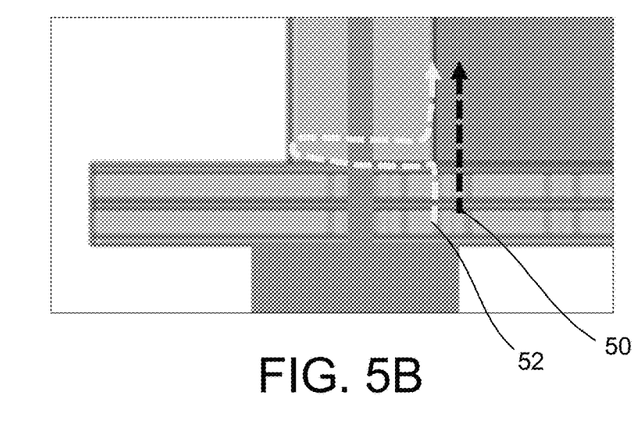

For example, and such as shown in FIG. 6A, the fastener 66 (e.g., a threaded fastener or bolt) passes through and along the wall 63 and through the PCB 64. The fastener 66 has a head at one end (e.g., at the distal end of the wall of the waveguide from the PCB) and is secured at the waveguide-PCB construction (to secure the waveguide to the PCB) via a nut 68 at the other end of the fastener (the end of the fastener that protrudes through the PCB at the opposite side of the PCB from where the interface end of the waveguide wall makes electrical contact with the PCB). The notch or gap 60 is established at the interface end of the wall 63 at a location where the fastener 66 passes along and through the wall 63, such that a portion of the fastener is exposed and a portion of the PCB at that location (outboard of the contact area 67) is also exposed. This concentrates the force applied by the fastener (which facilitates the electrical contact) to a reduced area that includes the ideal contact point 67. Thus, electrical currents that may otherwise be deviated by gaps in contact between the waveguide and the PCB (e.g., see the deviated current path 52 in FIG. 5B) instead flow continuously between the PCB and the waveguide. Although shown as a threaded bolt and nut, the fastener may comprise another suitable type of fastener, such as, for example, a screw that threads into the PCB or into the wall of the waveguide or the like.

Figure 6B:
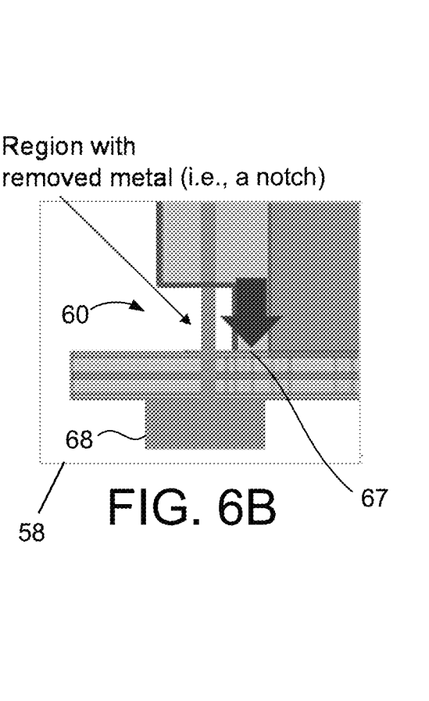
FIG. 6B is an enlarged plan view of a portion of the PCB waveguide interface of FIG. 6A.

As illustrated in FIG. 6B (showing an enlarged portion 58 of FIG. 6A), the presence of the air gap or notch 60 results in an increase in pressure provided by the fastener 66 (e.g., as the nut 68 is tightened onto the threaded end of the fastener) between the waveguide 62 and the PCB 64 by reducing the area of contact between the waveguide 62 and PCB 64 around or near the fastening or clamping region of the fastener, such as where the nut 68 is located (e.g., contact area 67). This is because pressure is equal to force divided by area. When force is constant (i.e., the force applied by the fastener) and the area at which the force is applied is decreased (as achieved by the presence of the gap at the interface end of the waveguide), pressure increases.

Due to the nature of the air gap (i.e., removing contact opposite of the ideal or enhanced contact point 67), the increased pressure increases or enhances electrical contact between the waveguide 62 and the PCB 64 at the contact point or area 67 (i.e., an edge or side of the waveguide 62). The waveguide 62 may include an air gap at each fastener 66 or at each vertex. The presence of the gaps and the increased pressure at the contact points or areas 67 encourages electrical currents to flow continuously in a straight line and thus improves RF performance by reducing insertion loss and crosstalk, especially when compared to a traditional wall-to-wall approach, without appreciably increasing the cost of the waveguide 62.

The system may comprise various sensors, such as radar or lidar sensors or the like, that utilize aspects described above. The sensing system may utilize aspects of the systems described in U.S. Pat. Nos. 9,753,121; 9,689,967; 9,599,702; 9,575,160; 9,146,898; 9,036,026; 8,027,029; 8,013,780; 7,053,357; 7,408,627; 7,405,812; 7,379,163; 7,379,100; 7,375,803; 7,352,454; 7,340,077; 7,321,111; 7,310,431; 7,283,213; 7,212,663; 7,203,356; 7,176,438;

7,157,685; 6,919,549; 6,906,793; 6,876,775; 6,710,770; 6,690,354; 6,678,039; 6,674,895 and/or 6,587,186, and/or International Publication Nos. WO 2018/007995 and/or WO 2011/090484, and/or U.S. Publication Nos. US-2018-0231635; US-2018-0045812; US-2018-0015875; US-2017-0356994; US-2017-0315231; US-2017-0276788; US-2017-0254873; US-2017-0222311 and/or US-2010-0245066, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular radar sensing system, the vehicular radar sensing system comprising:
   a radar sensor disposed at a vehicle so as to sense exterior of the vehicle;
   wherein the radar sensor comprises at least one transmitter that transmits radio signals, and at least one receiver that receives radio signals, and wherein received radio signals received by the at least one receiver are transmitted radio signals that are reflected from an object present in a field of sensing of the radar sensor;
   a processor operable to process an output of the at least one receiver;
   wherein the radar sensor comprises a printed circuit board having circuitry disposed thereat;
   wherein the radar sensor comprises a waveguide, and wherein the waveguide comprises a wall having an interface end that is in electrical contact with the printed circuit board, and wherein the wall at least partially bounds a portion of the printed circuit board and has an inboard side facing inboard toward the at least partially bounded portion of the printed circuit board and an outboard side facing outboard away from the at least partially bounded portion of the printed circuit board; and
   wherein the interface end of the wall of the waveguide comprises at least one notch present at the outboard side of the wall to establish a respective at least one area of electrical contact between the interface end of the waveguide and the printed circuit board inboard of the respective at least one notch.

2. The vehicular radar sensing system of claim 1, wherein the waveguide comprises a plurality of walls, and wherein the at least one notch is at the outboard side of at least one respective wall of the waveguide.

3. The vehicular radar sensing system of claim 2, wherein the at least one notch comprises a plurality of notches, and wherein each notch of the plurality of notches is at an end region of a respective one of the walls.

4. The vehicular radar sensing system of claim 1, wherein the waveguide is secured to the printed circuit board via at least one fastener.

5. The vehicular radar sensing system of claim 4, wherein the at least one notch is at the at least one fastener.

6. The vehicular radar sensing system of claim 5, wherein the at least one notch exposes a portion of the at least one fastener.

7. The vehicular radar sensing system of claim 6, wherein presence of the at least one notch (i) reduces the area of electrical contact between the interface end of the wall of the waveguide and the printed circuit board inboard of the respective at least one notch and (ii) increases a pressure provided by the at least one fastener at the area of electrical contact between the interface end of the wall of the waveguide and the printed circuit board.

8. The vehicular radar sensing system of claim 7, wherein the increased pressure increases electrical connection between the interface end of the wall of the waveguide and the printed circuit board.

9. The vehicular radar sensing system of claim 5, wherein the waveguide comprises a shape, and wherein each vertex of the shape of the waveguide is secured to the printed circuit board via a respective fastener.

10. The vehicular radar sensing system of claim 1, wherein the waveguide is secured to the printed circuit board via a plurality of fasteners, and wherein the at least one notch comprises a plurality of notches, and wherein a notch of the plurality of notches is at a respective fastener of the plurality of fasteners.

11. The vehicular radar sensing system of claim 1, wherein the waveguide comprises a metal waveguide.

12. A vehicular radar sensing system, the vehicular radar sensing system comprising:
   a radar sensor disposed at a vehicle so as to sense exterior of the vehicle;
   wherein the radar sensor comprises at least one transmitter that transmits radio signals, and at least one receiver that receives radio signals, and wherein received radio signals received by the at least one receiver are transmitted radio signals that are reflected from an object present in a field of sensing of the radar sensor;
   a processor operable to process an output of the at least one receiver;
   wherein the radar sensor comprises a printed circuit board having circuitry disposed thereat;
   wherein the radar sensor comprises a waveguide, and wherein the waveguide comprises a wall having an interface end that is in electrical contact with the printed circuit board, and wherein the wall at least partially bounds a portion of the printed circuit board; and
   wherein the interface end of the wall of the waveguide comprises at least one notch to establish a respective at least one area of electrical contact between the interface end of the waveguide and the printed circuit board; and
   wherein the waveguide is secured to the printed circuit board via at least one fastener disposed in and along the wall and at least partially through the printed circuit board, and wherein the at least one notch is present at the interface end of the wall where a portion of the at least one fastener is located.

13. The vehicular radar sensing system of claim 12, wherein the waveguide comprises a plurality of walls, and wherein the at least one notch is at an outboard side of at least one respective wall of the waveguide.

14. The vehicular radar sensing system of claim 13, wherein the at least one notch comprises a plurality of notches, and wherein each notch of the plurality of notches is at an end region of a respective one of the walls.

15. The vehicular radar sensing system of claim 12, wherein presence of the at least one notch (i) reduces the area of electrical contact between the interface end of the wall of the waveguide and the printed circuit board inboard of the respective at least one notch and (ii) increases a pressure provided by the at least one fastener at the area of electrical contact between the interface end of the wall of the waveguide and the printed circuit board.

16. The vehicular radar sensing system of claim 15, wherein the increased pressure increases electrical connection between the interface end of the wall of the waveguide and the printed circuit board.

17. The vehicular radar sensing system of claim 12, wherein the waveguide comprises a shape, and wherein each vertex of the shape of the waveguide is secured to the printed circuit board via a respective fastener.

18. A vehicular radar sensing system, the vehicular radar sensing system comprising:
 a radar sensor disposed at a vehicle so as to sense exterior of the vehicle;
 wherein the radar sensor comprises at least one transmitter that transmits radio signals, and at least one receiver that receives radio signals, and wherein received radio signals received by the at least one receiver are transmitted radio signals that are reflected from an object present in a field of sensing of the radar sensor;
 a processor operable to process an output of the at least one receiver;
 wherein the radar sensor comprises a printed circuit board having circuitry disposed thereat;
 wherein the radar sensor comprises a waveguide, and wherein the waveguide comprises a plurality of walls having an interface end that is in electrical contact with the printed circuit board, and wherein the wall bounds a portion of the printed circuit board and has an inboard side facing inboard toward the bounded portion of the printed circuit board and an outboard side facing outboard away from the bounded portion of the printed circuit board; and
 wherein the interface end of the plurality of walls of the waveguide comprises a plurality of notches present at the outboard side of the plurality of walls to establish respective areas of electrical contact between the interface end of the waveguide and the printed circuit board inboard of the respective notches.

19. The vehicular radar sensing system of claim 18, wherein the waveguide is secured to the printed circuit board via a plurality of fasteners that are disposed in and along respective walls of the plurality of walls of the waveguide and at least partially through the printed circuit board.

20. The vehicular radar sensing system of claim 19, wherein each notch of the plurality of notches is present at the interface end of a respective wall where a portion of a respective fastener of the plurality of fasteners is located.

* * * * *